United States Patent [19]

Gosney

[11] 4,025,801
[45] May 24, 1977

[54] REGENERATIVE MOS TRANSISTOR CHARGE DETECTORS FOR CHARGE COUPLED DEVICE SHIFT REGISTERS IN A MULTIPLEXING SYSTEM

[75] Inventor: William Milton Gosney, Richardson, Tex.

[73] Assignee: Texas Instruments Incorporated, Dallas, Tex.

[22] Filed: May 19, 1976

[21] Appl. No.: 687,731

Related U.S. Application Data

[62] Division of Ser. No. 499,717, Aug. 22, 1974, Pat. No. 3,979,603.

[52] U.S. Cl. .................. 307/362; 307/221 D; 307/243; 307/279; 307/DIG. 3
[51] Int. Cl.² .................. H03K 5/18; H03K 5/20; H03K 3/286; H03K 3/353
[58] Field of Search ....... 307/221 C, 221 D, 235 F, 307/235 K, 235 R, 235 T, 235 W, 238, 240, 241, 242, 279, 304, DIG. 3, 251; 328/103, 104, 152, 154

[56] References Cited

UNITED STATES PATENTS

| | | | |
|---|---|---|---|
| 3,678,473 | 7/1972 | Wahlstrom | 307/238 X |
| 3,750,155 | 7/1973 | Oman | 328/104 X |
| 3,758,794 | 9/1973 | Kosonocky | 307/221 C X |
| 3,774,176 | 11/1973 | Stein et al. | 307/DIG. 3 X |
| 3,838,295 | 9/1974 | Lindell | 307/DIG. 3 X |
| 3,891,977 | 6/1975 | Amelio et al. | 307/DIG. 3 X |
| 3,892,984 | 7/1975 | Stein | 307/279 |
| 3,955,101 | 5/1976 | Amelio et al. | 307/221 D X |

Primary Examiner—John S. Heyman
Assistant Examiner—Larry N. Anagnos
Attorney, Agent, or Firm—Harold Levine; Richard L. Donaldson; James T. Comfort

[57] ABSTRACT

The disclosure relates to improved detectors for use in digital charge coupled device (CCD) applications as, for example, in a multiplexing system, for recreating full logic voltage levels by detecting extremely small amounts of charge available in CCD bits. This is accomplished by means of a flip-flop circuit wherein opposite nodes of the flip-flop are precharged to a predetermined intermediate level between a logical 0 and a logical 1, one of the nodes being a reference node and the other node being coupled to a CCD storage device. During sampling of the bits being read out from the CCD storage device, the detecting node of the flip-flop will have its voltage altered, either upwardly or downwardly, from the charge on the CCD being read out. This will cause an imbalance in the flip-flop and cause the flip-flop to conduct on only one side thereof, this being determined by the charge detected. In this way, a very low level signal can be detected and amplified to a full logic voltage level for readout.

7 Claims, 7 Drawing Figures

4,025,801

REGENERATIVE MOS TRANSISTOR CHARGE DETECTORS FOR CHARGE COUPLED DEVICE SHIFT REGISTERS IN A MULTIPLEXING SYSTEM

This is a division, of application Ser. No. 499,717, filed Aug. 22, 1974, now U.S. patent No. 3,979,603.

This invention relates to regenerative charge detectors for charge coupled devices (CCD) and, more specifically, to a flip-flop circuit capable of detecting very small charge levels accurately and amplifying them to a full logical level signal.

Charge coupled devices comprise a new class of sequential memory circuits wherein extreme structural simplicity offers a high data packing density. The high packing density is achieved by trading off voltage gain for a smaller bit size. Data is stored and transferred in the form of charge held in capacitive storage. Charge coupled devices are well known in the prior art and therefore will not be discussed in detail herein. The prior art has had a problem in detecting the output of CCD memory circuits. The problem which is encountered in reading out such CCD memory circuits is to recreate the full logic voltage levels by detecting the extremely small amount of charge available in the CCD bits. Furthermore, the detection process must be reliable. That is, it must not be critically dependent upon supply voltage, frequency, temperature and operating conditions of the CCD.

One prior art CCD charge detector has been shown as a resistively loaded diode detector. While this simple diode detector is an excellent research tool because it is easy to implement and can be used for analytical evaluation of both analog and digital circuits, it has displayed poor sensitivity and is therefore inapplicable for high production volume digital CCD products. A further type of prior art CCD detector is called a precharged detector because the output diode voltage is set or precharged to a fixed reference voltage prior to initiating the charge detection. This type of charge detector, however, has had a problem with gain. As the number of bits on a chip becomes greater, the bit size becomes steadily smaller. Thus, the available signal swing at the output diode becomes smaller due to capacitive loading. Simply increasing the gain of the amplifiers is not sufficient because that also results in a decrease in speed and stability. Therefore, this second type of prior art CCD detector also has shortcomings which cannot be tolerated.

In accordance with the present invention, there is provided a circuit which overcomes the above-noted problems and provides an improved detector for accomplishing the desired detection function in digital CCD applications. Briefly, the above is accomplished by providing a detector which comprises an IGFET flip-flop wherein the two nodes are precharged to a voltage $v_{out}$ which is substantially $2V_{tx}$ ($V_{tx}$ = IGFET gate threshold voltage). The two nodes are then isolated from each other and the charge on the output device of the CCD, which will be either higher or lower than the node voltages is transferred to one node. When gain is restored to the flip-flop on the next clock period, the slight imbalance is amplified, driving one node quickly toward logic level "one" and the other toward logic level "zero." There is then provided an output from the flip-flop which is a recreation of the full voltage logic levels, regardless of the size of the charge on the CCD device. The invention thus features a regenerative detector circuit utilizing positive feedback to achieve extremely high gain. The signal to be detected initiates the start of the positive feedback voltage gain or regeneration. Such a regenerative detector is to be distinguished from a CCD regenerator, i.e., a circuit comprising a detector, amplifier, and input buffer used for refreshing or redigitizing the slowly decaying signal in a CCD, and which may or may not include a regenerative circuit as the detector and amplifier.

It is yet a further object of this invention to provide a regenerative charge detector for charge coupled devices which is capable of reconstructing logic levels from small charge storage in the presence of severe capacitive loading without sacrificing speed. The above objects and still further objects of the invention will immediately become apparent to those skilled in the art after consideration of the following preferred embodiments thereof, which are provided by way of example and not by way of limitation wherein.

Figure 1:
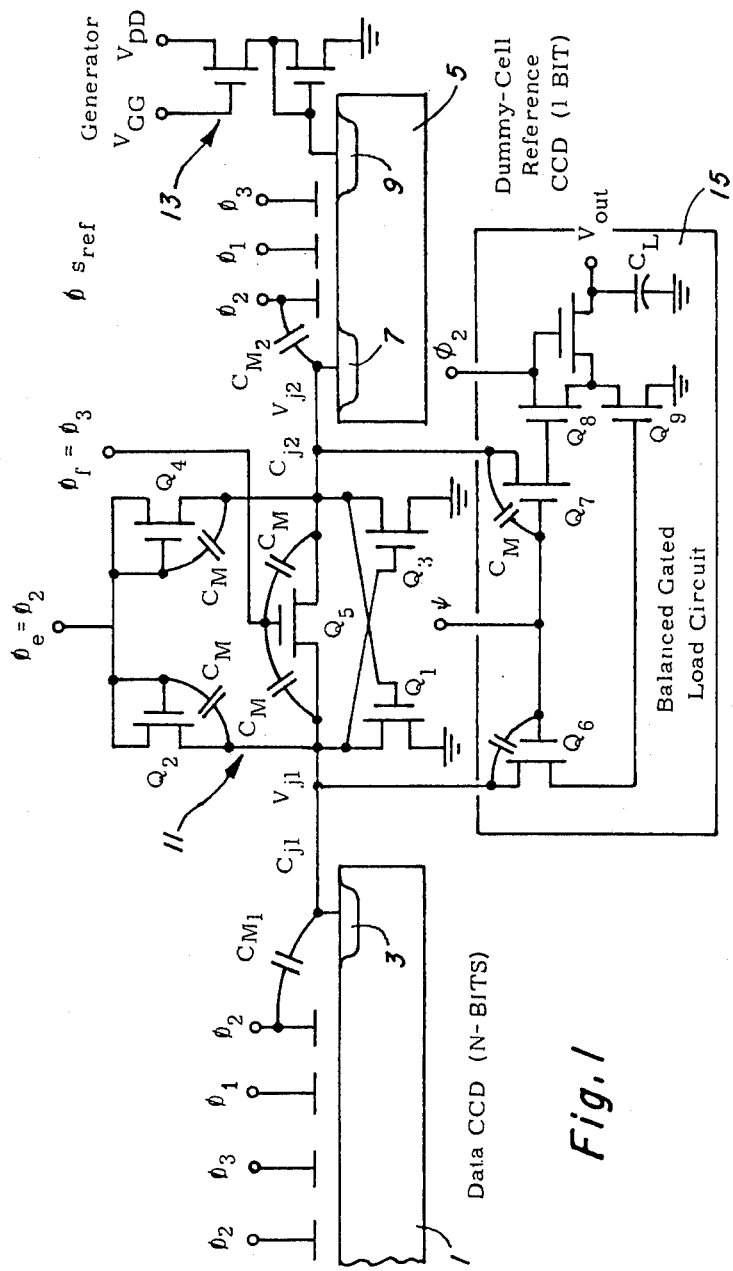
FIG. 1 is a circuit diagram of a first embodiment of the invention.
Figure 6:
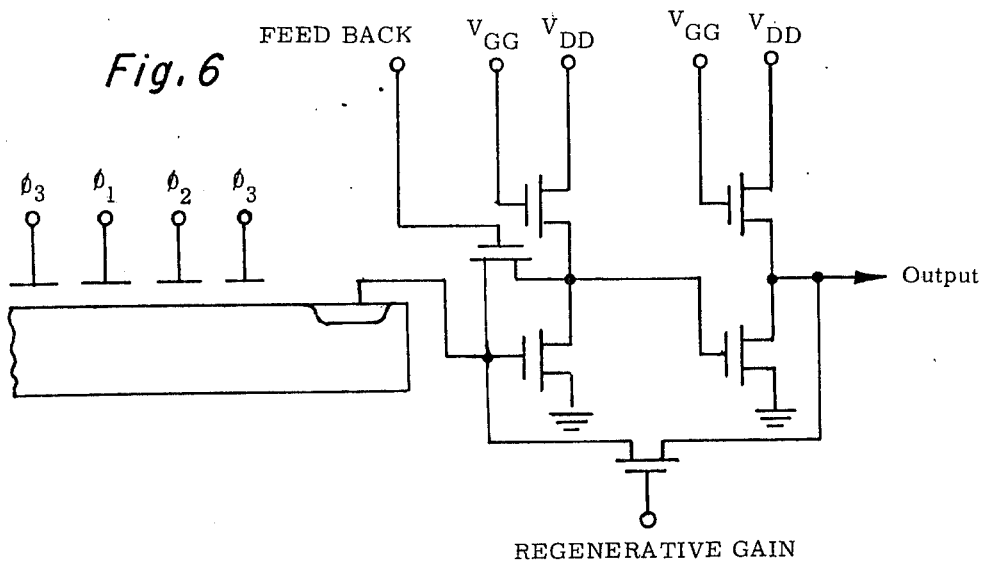
FIG. 6 is a circuit diagram of a third embodiment of the present invention.
Figure 7:
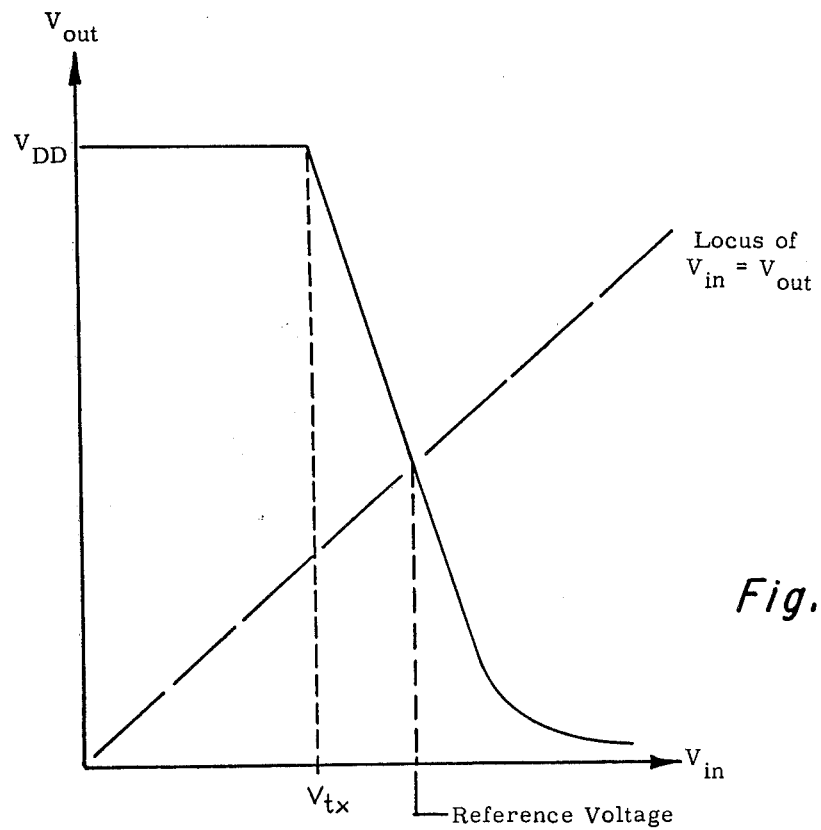

FIG. 7 is a diagram to determine reference voltage for the embodiment of FIG. 6. Referring now to FIG. 1, there is shown a schematic diagram of a regenerative detector in accordance with the present invention for use with a single three phase charge coupled device. The detector circuit is operated in accordance with the same clock signals which are used to operate the charge coupled device. Therefore, as can be seen, the enable (or gain) clock pulse is shown as $\phi_2$ and the feedback clock pulse is shown as $\phi_3$. The sample signal is provided by an external clock. A portion of a data CCD 1 is shown wherein data is stored in the form of charge which can be transferred or shifted along by proper sequential operation of the clock pulses $\phi_1$, $\phi_2$, $\phi_3$ as is well known in the art. The charge coupled device 1 includes an output diode 3 formed therein. The output diode 3 is coupled to node $V_{j1}$ of the detector circuit 11. A dummy reference CCD device 5 with diodes 7 and 9 also provides a predetermined reference signal to node $V_{j2}$ of the detector as shown in FIG. 1.

The detector 11 itself includes five IGFET's, for example MOS transistors, of which transistors $Q_1$, $Q_2$, $Q_3$ and $Q_4$ comprise two MOS ratio-type inverters interconnected to form a flip-flop. One node of the flip-flop, designated $V_{j1}$ is connected to the output diode 3 of the CCD 1. The other node, $V_{j2}$, is a dummy node. It also contains a dummy gate with overlap capacitance $C_{M2}$ such that $$\frac{CM1}{C_{j1}} = \frac{CM2}{C_{j2}}$$

where $C_{j1}$ and $C_{j2}$ comprise the total capacitances connected to node $V_{j1}$ and $V_{j2}$. A function of $CM_1$ and $CM_2$ is to insure that the node voltages $V_{j1}$ and $V_{j2}$ are equally affected by the turning on of clock signal $\phi_2$. The detector also includes a feedback signal ($\phi_f$) which is operated by phase $\phi_3$ of the clock and an enable clock pulse ($\phi_e$) line which is operated by a signal from clock $\phi_2$ to operate transistors $Q_2$ and $Q_4$.

The circuit also includes a generator 13 which provides a surface potential of approximately $2V_{tx}$ in amplitude. This is shifted across reference CCD 5 simultaneously with the data bits in data CCD 1 as previously discussed.

The output from the detector 11 is sensed by the balanced gated load circuit 15 wherein, during a $\Psi$ timing signal, both transistors $Q_6$ and $Q_7$ will be energized. One of these transistors will transfer a 0 or ground signal and the other will transfer a 1 or positive signal, depending upon the states of the nodes $V_{j1}$ and $V_{j2}$. Therefore, only one of transistors $Q_8$ and $Q_9$ will be energized to provide either a ground or a $V_{DD}$ output during the $\phi_2$ time period.

Figure 2:
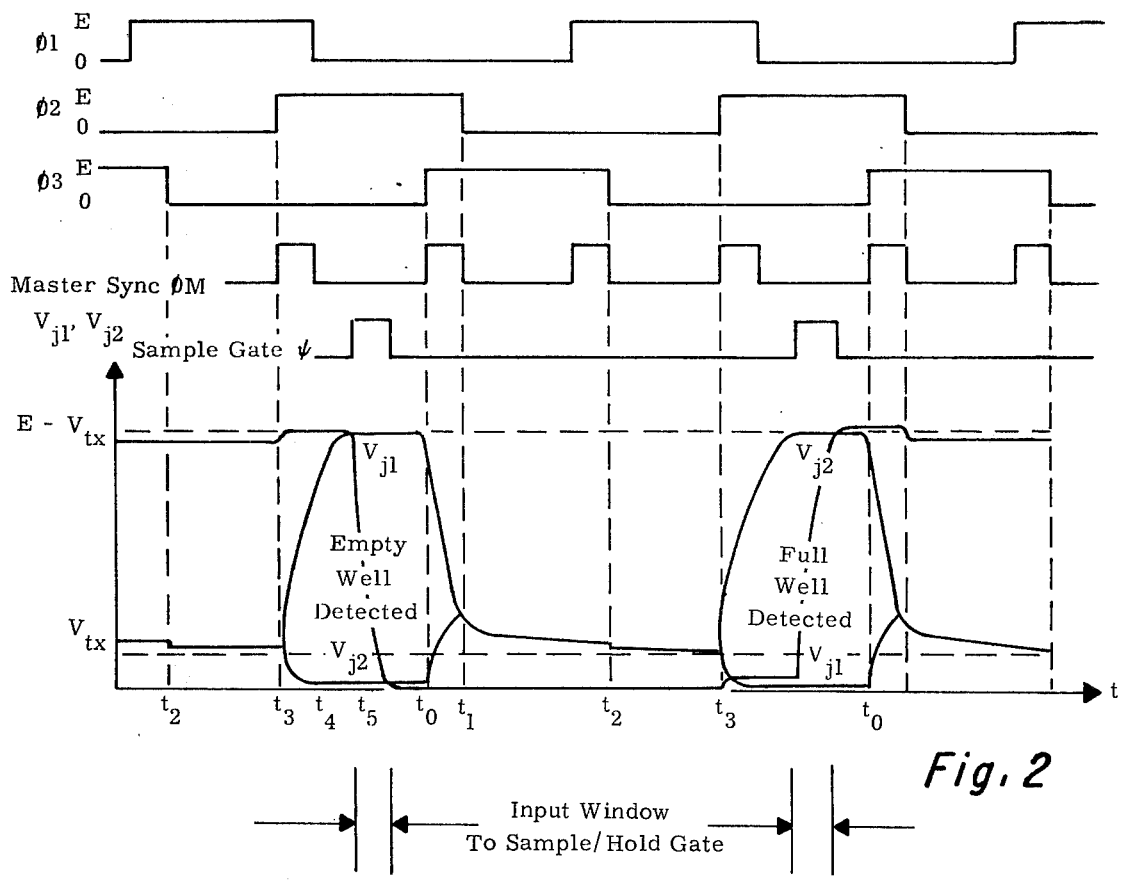
FIG. 2 is a timer diagram associated with the embodiment of FIG. 1.
Figure 2:
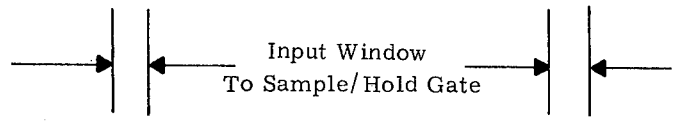

The operation of the circuit of FIG. 1 will now be explained with reference to the timing diagram of FIG. 2. The detector is initially precharged. This is accomplished when clock $\phi_2$ is on. Hence the inverters in the flip-flop are on. When $\phi_3$ turns on, each inverter output is connected to its input, establishing the condition on the transfer curve where $V_{out} = V_{in}$ which is approximately $2 V_{tx}$. The gain is turned off when $\phi_2$ turns off, resulting in $Q_2$ and $Q_4$ being cut off due to their effective $V_{gs}$ being 0. This action causes node $V_{j1}$ and $V_{j2}$ to be isolated after the feedback clock $\phi_3$ turns off. At this time, data is still stored under the last $\phi_1$ gate in the data CCD.

Charge detection is initiated when $\phi_2$ turns on. The surface potential beneath the last $\phi_1$ gate in the data CCD will be either higher or lower than the voltage on node $V_{j1}$, depending upon the state of the data at that point. Thus there will be a momentary current flow to equalize the surface potential under the last $\phi_1$ gate with $V_{j1}$. This results in $V_{j1}$ changing slightly with respect to its initial value and with respect to $V_{j2}$. The amount of change in $V_{j1}$ is given by:

$$\Delta V_{j1\ max} = (E - V_{tx}) \frac{C_g}{C_{j1}}$$

where $C_g$ is the capacitance of the CCD clock gates. E is the clock signal voltage amplitude and $V_{tx}$ = CCD gate threshold voltage (assumed equal to the IGFET threshold voltage). The capacitive loading factor $$\left( \frac{C_g}{C_{j1}} \right)^{-1}$$

may be as much as 10 or more. For 5 volt clocks, $\Delta V_{j1}$ will be in the 100 milivolt range. Regeneration is initiated when $\phi_2$ turns on. This turns the gain back on the flip-flop and the positive feedback or regeneration augments the change in $V_{j1}$. Since the two nodes have been placed in an imbalance voltage condition by the charge detection process, the act of turning on the gain in the flip-flop will cause the imbalance to be amplified. It can be seen that as the difference is amplified, one node is driven toward ground and the other node is driven toward $E-V_t$. The final state of $V_{j1}$ and $V_{j2}$ is determined by the initial bit of imbalance in voltage when $\phi_2$ is first turned on.

Figure 3:
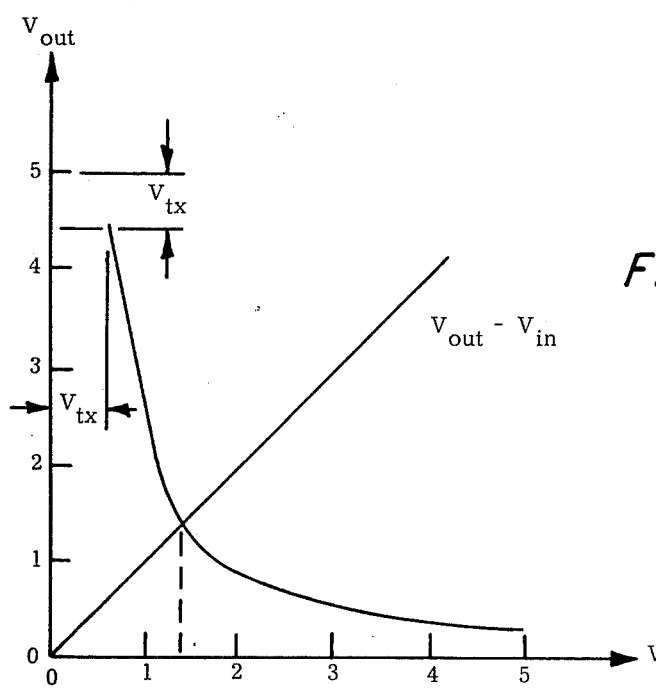
FIG. 3 is a transfer characteristic curve showing determination of the precharge voltage.

The cycle is repeated when feedback is returned and resets the nodes to their precharge level. The determination of the precharge level is determined with reference to FIG. 3. The flip-flop consists of two MOS ratio type converters. With the gate and drain of the transistor load connected together the operation is said to be in a saturated mode. The transfer characteristic of such an inverter is also shown in FIG. 3. When the flip-flop feedback gate is enabled, the outputs of the inverters are connected to their inputs. On the transfer characteristic, the intersection of a line of $V_{out} = V_{in}$ and the inverter transfer characteristic will be the precharge voltage. In most cases, the precharge voltage will be approximately twice the threshold voltage of the MOS transistors unless special level shifting circuitry is used. The load transistor could also be operated in a non-saturated mode, in which case its drain would be connected to $V_{DD}$ and its gate clocked by $\phi_2$ pulses.

The regenerative cycle can also be explained as follows with reference to FIG. 2: at $t_0$, the feedback clock turns on, and both node voltages $V_{j1}$ and $V_{j2}$ are set equal. At $t_1$, the enable clock turns the flip-flop gain off; node voltages decay toward $V_{tx}$. At $t_2$, feedback is turned off, the nodes are now isolated, but they are at equal potentials. At $t_3$, the enable gate turns on, turning the flip-flop gain back on. At the same time, the charge in the reference and data CCD's is conducted to the gates. Depending upon the ratio of the data current to the reference current, an imbalance is imposed upon the regenerating flip-flop. This initial imbalance is initiated at the same time that the gain is turned on, so that the correct logic level is regenerated at $V_{j1}$, and its inverse at $V_{j2}$. Regeneration can occur in less than 40ns.

At $t_4$, the same gate pulse turns on, connecting $V_{j1}$ and $V_{j2}$ to the driver and load of a ratioless driver pair. After forcing these devices into an on or off situation, the sample gate turns off at $t_5$, and the data is held until the next cycle. The cycle is repeated when the feedback clock turns back on.

It is known that a direct tradeoff on MOS inverters is gain for speed. As the load device is made with longer channels the gain increases for an inverter but the rise time is slowed. In order for the regenerative detector to function, it is required only that the gain be slightly greater than unity. Thus, once the initial node imbalance occurs, a full logic swing of $E-V_{tx}$ is achieved through regenerative action and not through brute force gain. Thus, the individual inverters can be quite fast.

Figure 4:
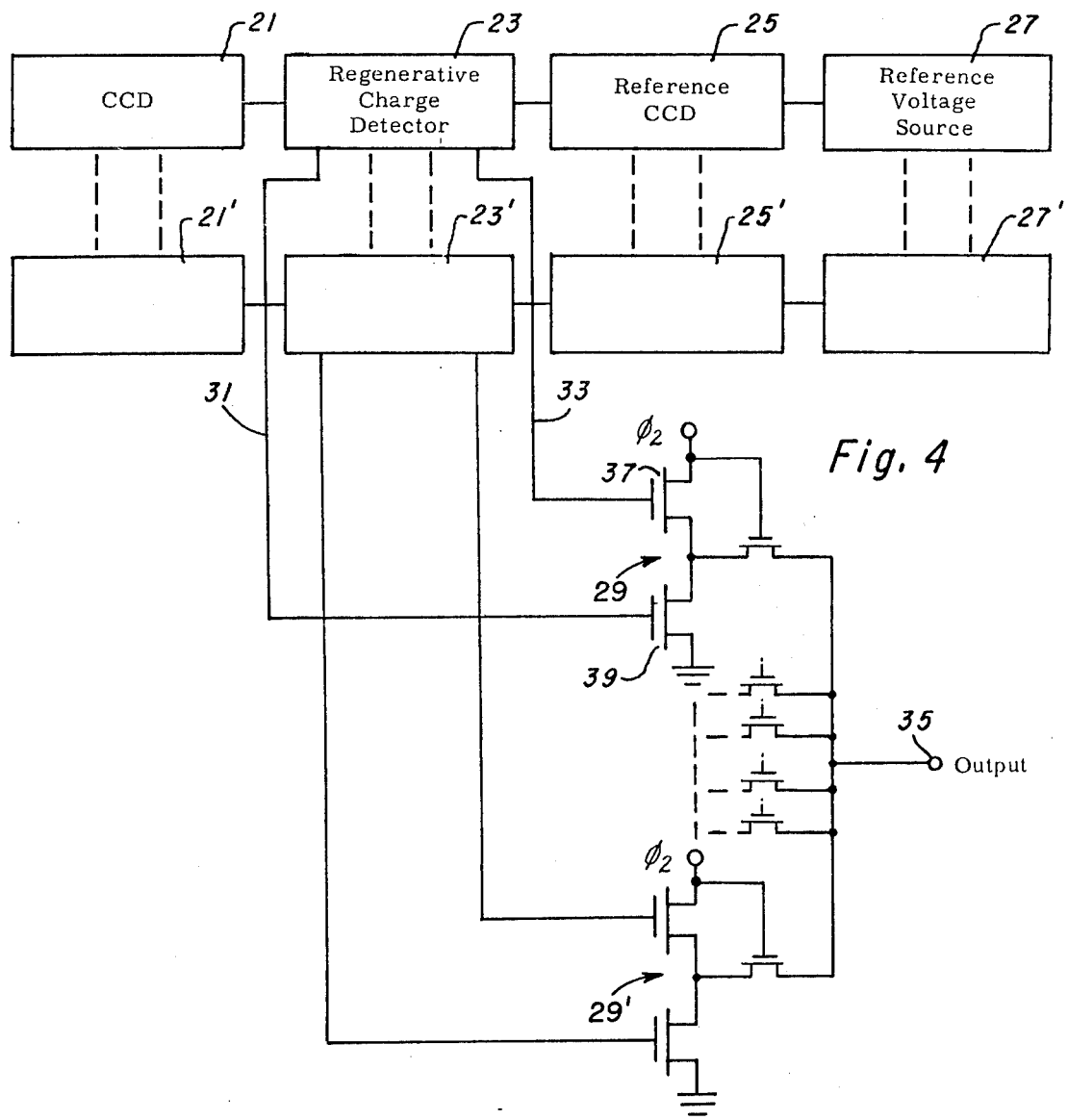
FIG. 4 is a circuit diagram of a second embodiment of the invention for use in conjunction with a multiplexing system.

Turning now to FIG. 4, there is shown a CCD storage system wherein a plurality of CCD storage devices 21 are provided, these devices being either on separate semiconductor slices or provided as a plurality of individual registers on the same semiconductor slice. As in the embodiment of FIG. 1, each of these devices 21 includes a regenerative charge detector 23, a reference CCD device 25 and a reference voltage source 27 as described above. The output of each of the regenerative charge detectors 23 will be fed through an associated output load device 29, there being one such output load device 29 for each of the regenerative charge detectors. These outputs will be derived from each of the junctions $V_{j1}$ and $V_{j2}$ of the regenerative charge detector.

Each of the regenerative charge detectors 23 is a tri-state output device and will provide either a logical one output, a logical zero output or no output, this depending upon whether that particular regenerative charge detector is to be utilized during this particular step of the multiplexing operation. Only one of the lines 31 and 33 will have a logical one and the other will automatically then have a logical zero. Therefore, if the regenerative charge detector 23 is being read out, a logical one will be read out by having a positive signal on line 33 and a ground signal on line 31. A logical zero will be read out by having a ground signal on line 33 and a positive signal on line 31. This signal will be read out through the output terminal 35. In the event the detector 23 is not the one being sampled during the present multiplexing step, both of the lines 31 and 33 will provide insufficient voltage to cause either the load transistors 37 or the driver transistor 39 to conduct. Therefore, the output at the output terminal 35 will be floating and will in no way affect the output signal. In this manner, it can be seen that so long as only one of this group of detectors 23 provides an actual zero and one signal on the output lines 31, 33 the remainder of the detectors 23 will be floating and will in no way affect the output. In this way, a single output circuit can be utilized for a plurality of storage devices. In this way, multiplexing can be accomplished with simple circuitry.

Figure 5:
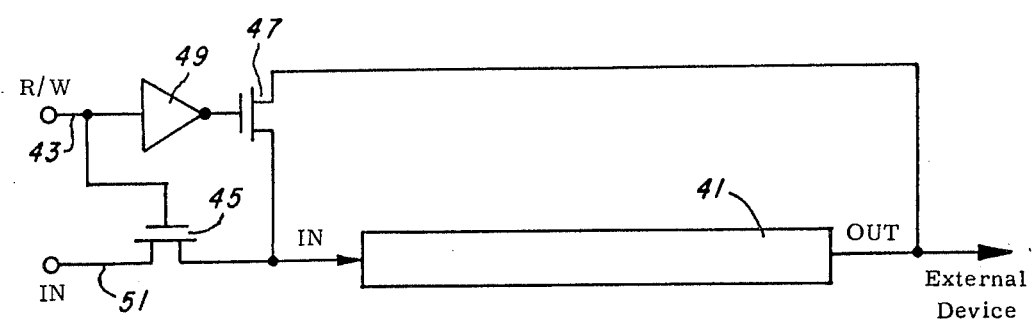
FIG. 5 is a circuit diagram of a CCD storage system.

Referring now to FIG. 5, there is shown a CCD storage device utilized as a shift register with capability of either recirculating and/or reading and writing information. The storage device 41 would include each of the elements 21, 23, 25 and 27 as well as one of the output circuits 29. The output, whether it be a one or a zero, can be read through an external device and can also be fed back to the input of the device 41 or, in other words, to the input of the CCD storage device. Depending upon whether the circuit is to be in the read or write mode, and, first assuming a read mode, a ground signal will be placed on the line 43, turning off the transistor 45 and turning on the transistor 47 through the inverter 49. This will allow the output signal from the device 41 to travel through transistor 47 and recirculate back into device 41 at its input. In the event that a write signal is provided at the line 43, the transistor 47 will be turned off and the transistor 45 will be turned on. Therefore, the output signal from the device 41 will be blocked and inhibited from returning to the input terminal, whereas new information can be read in on the input line 51 and passed through transistor 45 which is now conducting and fed into the storage device 41. It can be seen that there is here provided a simple circuit for read, write, and recirculation which requires merely two transistors and an inverter.

Referring now to FIG. 6, there is shown a further embodiment of a regenerative detector in accordance with the present invention which does not require a reference CCD device. This can be accomplished at the expense of making the detector sensitive to voltage levels within the detector circuit itself. The transfer characteristic for the circuit inverters is shown in FIG. 3. The reference voltage as shown in FIG. 3 is the intersection of the locus of $V_{out} = V_{in}$ and the stage transfer function. Thus, the data from the CCD is detected as a 1 and 0, depending upon whether or not the surface potential of the bit being detected in the CCD is greater than or less than the reference voltage.

The detector operation of the circuit of FIG. 6 is similar to that of FIG. 1. The operating cycle starts with gain and feedback on. Then gain is turned off followed by feedback turned off. This sets all nodes, (input, output and inter-stage interconnects) at or near the reference voltage. Then the last CCD clock is turned on, this being $\phi_3$, and the gain is turned on. The unbalance at the detector input caused by the sense of data in the CCD will tip the balance of the detector toward a logical level 1 or 0 at the output, and the regenerative action will fully drive the output to the extreme 1 or 0 level.

Though the invention has been described with respect to specific preferred embodiments thereof, many variations and modifications thereof will immediately become apparent to those skilled in the art. It is therefore the intention that the appended claims be interpreted as broadly as possible in view of the prior art to include all such variations and modifications.

I claim:

1. A data storage system comprising a plurality of charge coupled device shift register stores, each shift register including a plurality of stages, each having a plurality of transfer electrodes, means for applying multi-phase clock signals to said electrodes to shift data signals along said shift register, data output means for said shift register adjacent a selected electrode of one of said stages, said selected transfer electrode connected for application of a predetermined phase clock signal thereto; regenerative charge detector means comprising in combination:

bi-stable circuit means comprising a pair of cross-coupled inverter stages connected between a first voltage supply line, and a second voltage supply line comprising a fixed supply voltage line, said bi-stable circuit having first and second nodes;

said output means of said shift register connected to said first node;

means for precharging the first and second nodes to a reference voltage set by a value $V_{out} = V_{in}$ on an output voltage ($V_{out}$) versus input voltage ($V_{in}$) transfer characteristic of said inverter stages;

transmission means including a one stage charge coupled device connected between said second node and a voltage source for generating a voltage equal to said reference voltage value, said one stage charge coupled device including a like plurality of transfer electrodes as a stage of said shift register, and means for applying said multiphase clock signals to the transfer electrodes of said one stage CCD for operation thereof in synchronism with said shift register;

said transmission means controllable by said clock signals for applying a voltage equal to said reference voltage to said second node during said predetermined clock signal phase;

means for applying, following said precharging step, the said predetermined phase clock signal to each of said selected transfer electrode, said first supply line and said transmission means, for transferring a data signal to the output means of said shift register to cause regenerative imbalance between the voltages at said first and second nodes in a sense corresponding to the level of said transferred data signal compared with that of said reference voltage; and logic output means coupled to said first and second nodes for generating a logic output signal according to the sense of said imbalance;

and means for coupling the logic output means of each data store in sequence to a common system output to multiplex said logic output signals from said plurality of detector means.

2. A data storage system according to claim 1, wherein each of said precharging means comprises a gated feedback path connected between said first and second nodes of said bi-stable circuit.

3. A data storage system according to claim 2, wherein each said bi-stable circuit and each said gated feedback path comprises insulated gate field effect transistors.

4. A data storage system according to claim 1, wherein each said logic output means comprises a tri-state insulated gate field effect transistor logic output circuit.

5. A data storage system according to claim 1, wherein said coupling means comprises insulated gate field effect transistors.

6. A data storage system comprising a plurality of charge coupled device shift register data stores, each shift register including a plurality of transfer electrodes, means for applying multiphase clock signals to said electrodes to shift data signals along said shift shift register, data output means for said shift register adjacent a selected electrode of one of said stages, said selected transfer electrode connected for application of a predetermined phase clock signal thereto; regenerative charge detector means comprising in combination:
bi-stable circuit means comprising a pair of cross-coupled inverter stages connected between a first voltage supply line, and a second voltage supply line comprising a fixed supply voltage line, said bi-stable circuit having first and second nodes;
said output means of said shift register connected to said first node;
gated feedback path means connected between said first and second nodes of said bi-stable circuit, means for enabling said gated feedback means to connect said first and second nodes together for precharging said nodes to a common reference voltage;
analog signal transmission means including a one stage charge coupled device having an output connected to said second node and an input selectively connectable to a voltage source for generating a voltage equal to said reference voltage value, said one stage charge coupled device including a like plurality of transfer electrodes as a stage of said shift register and operated synchronously therewith by said multiphase clock signals;
means for applying, following said precharging step, said predetermined clock voltage phase to said selected transfer electrode, said first supply line and said transmission means, to transfer a data signal to the output means of said shift register, and to apply said reference voltage to said second node to cause regenerative imbalance between the voltages at said first and second nodes in a sense corresponding to the level of said transferred data signal compared with that of said reference voltage; and
logic circuit output means coupled to said first and second nodes for generating a logic output signal according to the sense of said imbalance;
and means for coupling the logic circuit output means in sequence to a common system output to multiplex said logic output signals from said plurality of charge detector means;
and wherein
said bi-stable circuit means, said gated feedback means, said logic circuit output means and said coupling means comprise insulated gate field effect transistors.

7. A data storage system according to claim 6, wherein each said logic circuit output means comprises a tristate logic circuit.

* * * * *